US012633880B2

(12) United States Patent
Osgooei

(10) Patent No.: US 12,633,880 B2
(45) Date of Patent: May 19, 2026

(54) INDUCTORLESS SELF-TUNED INPUT-MATCHING LOW-NOISE AMPLIFIER WITH VERY LOW NOISE FIGURE AND Gm BOOST

(71) Applicant: Qorvo US, Inc., Greensboro, NC (US)

(72) Inventor: Mostafa Savadi Osgooei, Linz (AT)

(73) Assignee: Qorvo US, Inc., Greensboro, NC (US)

( * ) Notice: Subject to any disclaimer, the term of this patent is extended or adjusted under 35 U.S.C. 154(b) by 479 days.

(21) Appl. No.: 18/298,426

(22) Filed: Apr. 11, 2023

(65) Prior Publication Data

US 2023/0378913 A1    Nov. 23, 2023

Related U.S. Application Data

(60) Provisional application No. 63/375,064, filed on Sep. 9, 2022, provisional application No. 63/400,502, filed on Aug. 24, 2022, provisional application No. 63/342,678, filed on May 17, 2022.

(51) Int. Cl.
| | |
|---|---|
| *H03F 1/22* | (2006.01) |
| *H03F 1/26* | (2006.01) |
| *H03F 1/56* | (2006.01) |
| *H03F 3/24* | (2006.01) |

(52) U.S. Cl.
CPC .................. *H03F 1/26* (2013.01); *H03F 1/56* (2013.01); *H03F 3/245* (2013.01); *H03F 2200/222* (2013.01); *H03F 2200/267* (2013.01); *H03F 2200/294* (2013.01); *H03F 2200/451* (2013.01)

(58) Field of Classification Search
CPC .................................... H03F 1/22; H03G 3/30

USPC .......................................... 330/311, 278, 279
See application file for complete search history.

(56) References Cited

U.S. PATENT DOCUMENTS

| | | |
|---|---|---|
| 7,496,334 B2 | 2/2009 | Saito |
| 10,903,798 B2 * | 1/2021 | Bozorg ..................... H03F 3/19 |
| 2008/0089440 A1 | 4/2008 | Curtis |
| 2010/0046769 A1 | 2/2010 | Kimura |

(Continued)

FOREIGN PATENT DOCUMENTS

| | | |
|---|---|---|
| CN | 103414439 B | 8/2016 |
| KR | 20200128870 A | 11/2020 |

OTHER PUBLICATIONS

Blaakmeer, S. et al., "Wideband Balun-LNA With Simultaneous Output Balancing, Noise-Canceling and Distortion-Canceling," IEEE Journal of Solid-State Circuits, vol. 43, No. 6, Jun. 2008, IEEE, pp. 1341-1350.

(Continued)

*Primary Examiner* — Henry Choe
(74) *Attorney, Agent, or Firm* — Withrow & Terranova, P.L.L.C.

(57) ABSTRACT
A low-noise amplifier is disclosed having a first transistor with a first current terminal coupled to a supply voltage rail through a load resistor and a second current terminal coupled to an input node, wherein a bias resistor is coupled between the input node and a fixed voltage node. A second transistor has a third current terminal coupled to an output node and a fourth current terminal coupled to the fixed voltage node. A feedback capacitor is coupled between the input node and the output node, wherein capacitance of the feedback capacitor is sized to eliminate the need for coupling an input impedance matching inductor to the input node.

27 Claims, 10 Drawing Sheets

(56)                  References Cited

U.S. PATENT DOCUMENTS

| | | |
|---|---|---|
| 2012/0299651 A1 | 11/2012 | Goel et al. |
| 2016/0232886 A1 | 8/2016 | Vaidhyanathan et al. |
| 2023/0378920 A1 | 11/2023 | Scott et al. |

OTHER PUBLICATIONS

Bruccoleri, F. et al., "Wide-band CMOS low-noise amplifier exploiting thermal noise canceling," IEEE Journal of Solid-State Circuits, vol. 39, No. 2, Feb. 2004, IEEE, 8 pages.

Wang, K. et al., "An Inductorless and Capacitorless LNA with Noise and Distortion Cancelation," 2011 3rd International Conference on Computer Research and Development, Mar. 11-13, 2011, Shanghai, China, IEEE, 5 pages.

Chen, W.-H. et al., "A Highly Linear Broadband CMOS LNA Employing Noise and Distortion Cancellation," IEEE Journal of Solid-State Circuits, vol. 43, No. 5, May 2008, IEEE, pp. 1164-1176.

Guo, B. et al., "A linearized common-gate low-noise amplifier using active cross-coupled feedback technique," Analog Integrated Circuits and Signal Processing, vol. 89, Issue 1, Oct. 2016, Springer Science+Business Media, pp. 239-248.

Kim, J. et al., "Wideband Inductorless Balun-LNA Employing Feedback for Low-Power Low-Voltage Applications," IEEE Transactions on Microwave Theory and Techniques, vol. 60, No. 9, Sep. 2012, IEEE, pp. 2833-2842.

Pang-Hsing, C. et al., "A Highly Linear Broadband CMOS LNA with Noise Cancellation," 2012 Spring Congress on Engineering and Technology, May 2012, IEEE, 4 pages.

Wang, H. et al., "A Wideband Inductorless LNA With Local Feedback and Noise Cancelling for Low-Power Low-Voltage Applications," IEEE Transactions on Circuits and Systems—I: Regular Papers, vol. 57, No. 8, Aug. 2010, IEEE, pp. 1993-2005.

Zhang, H. et al., "Linearization Techniques for CMOS Low Noise Amplifiers: A Tutorial," IEEE Transactions on Circuits and Systems—I: Regular Papers, vol. 58, No. 1, Jan. 2011, IEEE, pp. 22-36.

Extended European Search Report for European Patent Application No. 23174050.7, mailed Oct. 10, 2023, 11 pages.

Extended European Search Report for European Patent Application No. 23171220.9, mailed Oct. 11, 2023, 28 pages.

Jafari, et al., "A sub-1V dual-path noise and distortion canceling CMOS LNA for low power wireless applications," Microelectronics Journal, vol. 104, Sep. 15, 2020, Elsevier Ltd., 13 pages.

* cited by examiner

INDUCTORLESS SELF-TUNED INPUT-MATCHING LOW-NOISE AMPLIFIER WITH VERY LOW NOISE FIGURE AND Gm BOOST

RELATED APPLICATIONS

This application claims the benefit of provisional patent application Ser. No. 63/375,064, filed Sep. 9, 2022, and claims the benefit of provisional patent application Ser. No. 63/400,502, filed Aug. 24, 2022, and claims the benefit of provisional patent application Ser. No. 63/342,678, filed May 17, 2022, the disclosures of which are hereby incorporated herein by reference in their entireties.

This application is related to U.S. patent application Ser. No. 18/133,143, filed Apr. 11, 2023, now U.S. Pat. No. 12,562,696, and titled LOW NOISE AMPLIFIER (LNA) WITH DISTORTION AND NOISE CANCELLATION, which claims the benefit of provisional patent application Ser. No. 63/375,064, filed Aug. 9, 2022, and claims the benefit of provisional patent application Ser. No. 63/342, 678, filed May 17, 2022, the disclosures of which are hereby incorporated herein by reference in their entireties.

FIELD OF THE DISCLOSURE

The technology of the present disclosure relates to a low-noise amplifier structure without an input impedance matching inductor.

BACKGROUND

A low-noise amplifier (LNA) is a key block for a receive chain since it determines the sensitivity of the receiver. Assuming that enough gain is provided by the LNA, the noise contribution of the next stages can be significantly reduced at the input of the receiver. The input impedance of the LNA usually is conjugately matched with the source impedance to receive the maximum input power. On the other hand, the optimum source impedance to reach minimum noise figure is different from the actual source impedance, which causes trade-offs between input matching and achievable minimum noise figure. The LNAs in general are divided into narrow band and wideband amplifiers. The narrow band LNAs achieve a lower noise figure compared with wideband LNAs. On the other hand, unlike wideband LNAs, narrow band LNAs require off-chip matching components that make them less attractive for low-cost applications. The other key performance parameter of the LNA is the in-band and out-of-band linearity, which can be specified as second-order and third-order input-referred intercept points (IIP2 and IIP3) or a 1 dB saturation point. However, the linearity of the receive chain is determined mostly by the next stages of the LNA, and a highly nonlinear LNA can be saturated by lower input power levels. Therefore, to prevent earlier saturation of LNA output, the maximum gain of the LNA should be reduced, which subsequently increases the noise contribution of the next stages. The 4G/5G front-end modules employ multi-input LNA cores for intended bands for carrier aggregation and multiple input, multiple output functionality. Therefore, it is desirable that all the noise figure, input matching, and linearity requirements of a LNA are met without using any off-chip components to keep the integration cost low and to reduce occupied area within the module, which makes shrinking the size of the module possible.

SUMMARY

A low-noise amplifier (LNA) is disclosed having a first transistor with a first current terminal coupled to a supply voltage rail through a load resistor and a second current terminal coupled to an input node, wherein a bias resistor is coupled between the input node and a fixed voltage node. A second transistor has a third current terminal coupled to a feedback output node, and a fourth current terminal is coupled to the fixed voltage node. A feedback capacitor is coupled between a gate of the first transistor and the feedback output node, wherein capacitance of the feedback capacitor is sized to eliminate the need for coupling an input impedance matching inductor to the input node and meanwhile reduce the noise figure of the LNA.

In exemplary embodiments, the disclosed LNA is a self-tunable input-matching LNA for mid-high band 4G/5G front-end module applications achieving very low noise figure (NF<1 dB) and high gain (>20 dB). The need for an inductor-based input-matching network at the input node of the LNA is eliminated. The disclosed LNA is a wideband LNA that is made up of a common-gate (CG) stage that is configured as a wideband input-matching amplifier and a common-source (CS) amplifier to cancel the channel noise of the CG device at output. The disclosure provides for a transconductance (gm) boosting technique (a) to suppress considerably the significant noise contribution of the bias and load resistors of CG amplifier so that NF<1 dB can be achieved and (b) to automatically match the input resistance as the output tank is tuned without using any off-chip component. In addition to inherent distortion cancellation, selectivity characteristic of input return loss improves out-of-band linearity. By employing the device according to the present disclosure for designing a multi-core LNA die, the integration cost within a front-end module can be reduced considerably and a very low NF can be achieved.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
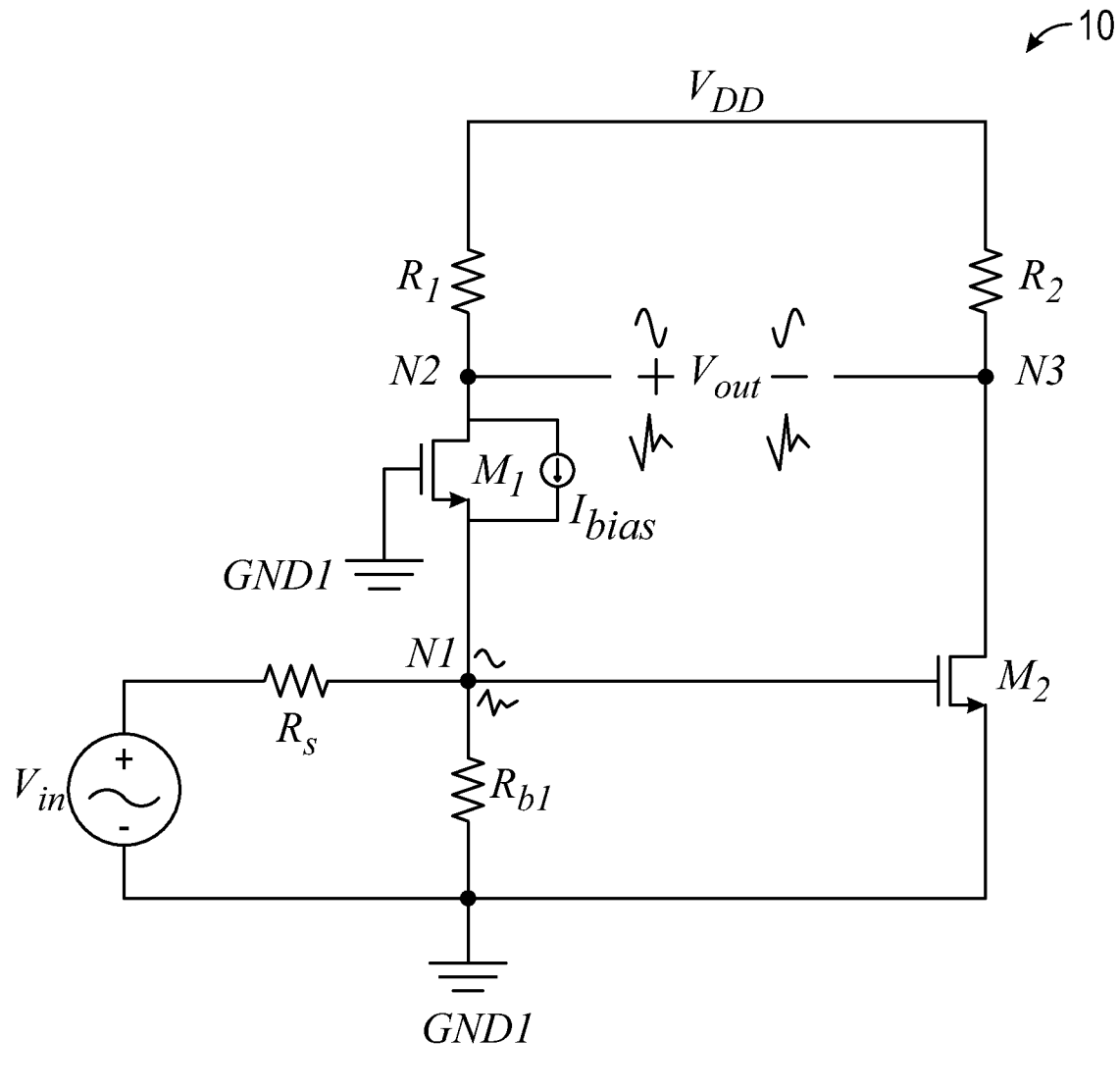
FIG. 1 is a schematic of a wideband differential output low-noise amplifier (LNA) with noise cancellation (bias circuit is not shown).

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The narrow band low-noise amplifier (LNA) is used widely for mobile applications since it provides a very low noise figure (NF<1 dB) while consuming reasonable current. The narrow band input matching is achieved by a series resonator at the input which is composed of off-chip components and the source degenerated inductor. The off-chip matching network is usually composed of a series inductor (L) and shunt capacitor (C) surface-mount devices that occupy considerable area in front-end modules and add cost. On the other hand, conventional wideband LNAs match over a wide frequency range without using off-chip components but suffer from a poor noise figure (NF>2 dB), which makes them less attractive for 4G or 5G front-end modules. Therefore, there is challenging trade-off between achievable noise figure and the input matching requirement. Disclosed is an LNA that addresses this trade-off and introduces a LNA without requiring any off-chip matching components (like a wideband LNA) while reducing the noise figure below 1 dB (like a narrow band LNA).

The schematic of conventional common gate-common source (CG-CS) wideband low-noise amplifier (LNA) 10 is shown in related art in FIG. 1. As depicted in related art in FIG. 1, the LNA 10 has a first transistor $M_1$ and a second transistor $M_2$. A drain of the first transistor $M_1$ is coupled to a supply rail $V_{DD}$ through a first resistor $R_1$, and a drain of the second transistor $M_2$ is coupled through a second resistor $R_2$. The first resistor $R_1$ and the second resistor $R_2$ may also be referred to generally as load resistors. A source of the first transistor $M_1$ is coupled to a fixed voltage node GND1 through a bias resistor $R_{b1}$. Note that complete bias circuitry is not shown and that drain and source terminals may also be commonly referred to as current terminals, while gates may be referred to as control terminals. A gate of the first transistor $M_1$ is coupled to bias voltage (not shown in FIG. 1), which configures the first transistor $M_1$ as a common gate amplifier. A current source $I_{bias}$ represents a bias current that flows to the bias resistor $R_{b1}$ from the source of the first transistor $M_1$. A source of the second transistor $M_2$ is coupled to the fixed voltage node GND1, which configures the second transistor $M_2$ as a common source amplifier. The fixed node GND1 is ground in this case.

A gate of the second transistor $M_2$ is coupled to a first node N1 that is between the source of the first transistor $M_1$ and the bias resistor $R_{b1}$. A radio frequency signal (RF) source $V_{in}$ with a RF source resistance $R_s$ is coupled across the bias resistor $R_{b1}$. An amplifier output voltage $V_{out}$ is shown between a second node N2 and a third node N3. The second node includes the drain of the first transistor $M_1$, and the third node N3 includes the drain of the second transistor $M_2$. Channel noise generated by the first transistor $M_1$ is represented by a jagged signal trace, and an RF signal generated by the RF source $V_{in}$ is represented by a sinusoidal signal trace at the first node N1. Out of phase amplified channel noise and the RF signal are depicted at the second node N2 and the third node N3, respectively.

Input impedance matching is provided by the first transistor $M_1$ that is common gate configured where $R_s=1/gm_1$. In parallel to the first transistor $M_2$, the second transistor $M_2$ provides some cancellation of the channel noise generated in the first transistor $M_1$. The channel noise of the first transistor $M_1$ is substantially cancelled because the channel noise appears in phase at the drains of the first transistor $M_1$ and the second transistor $M_2$, as shown in related art in FIG. 1, while the RF input signal appears in the opposite phase at the outputs. Therefore, noise cancellation occurs under the following conditions:

$$R_s \cdot gm_2 \cdot R_2 = R_1 \tag{1}$$

Assuming that input is matched to $R_s$, Equation (1) is simplified to $$gm_2 \cdot R_2 = gm_1 \cdot R_1 \tag{2}$$

which means that if the gain of the first transistor $M_1$ and the second transistor $M_2$ are the same, taking differentially the outputs at the drains of the first transistor $M_1$ and the second transistor $M_2$ cancels the channel noise of first transistor $M_1$ while the output voltage $V_{out}$ is amplified.

Figure 2:
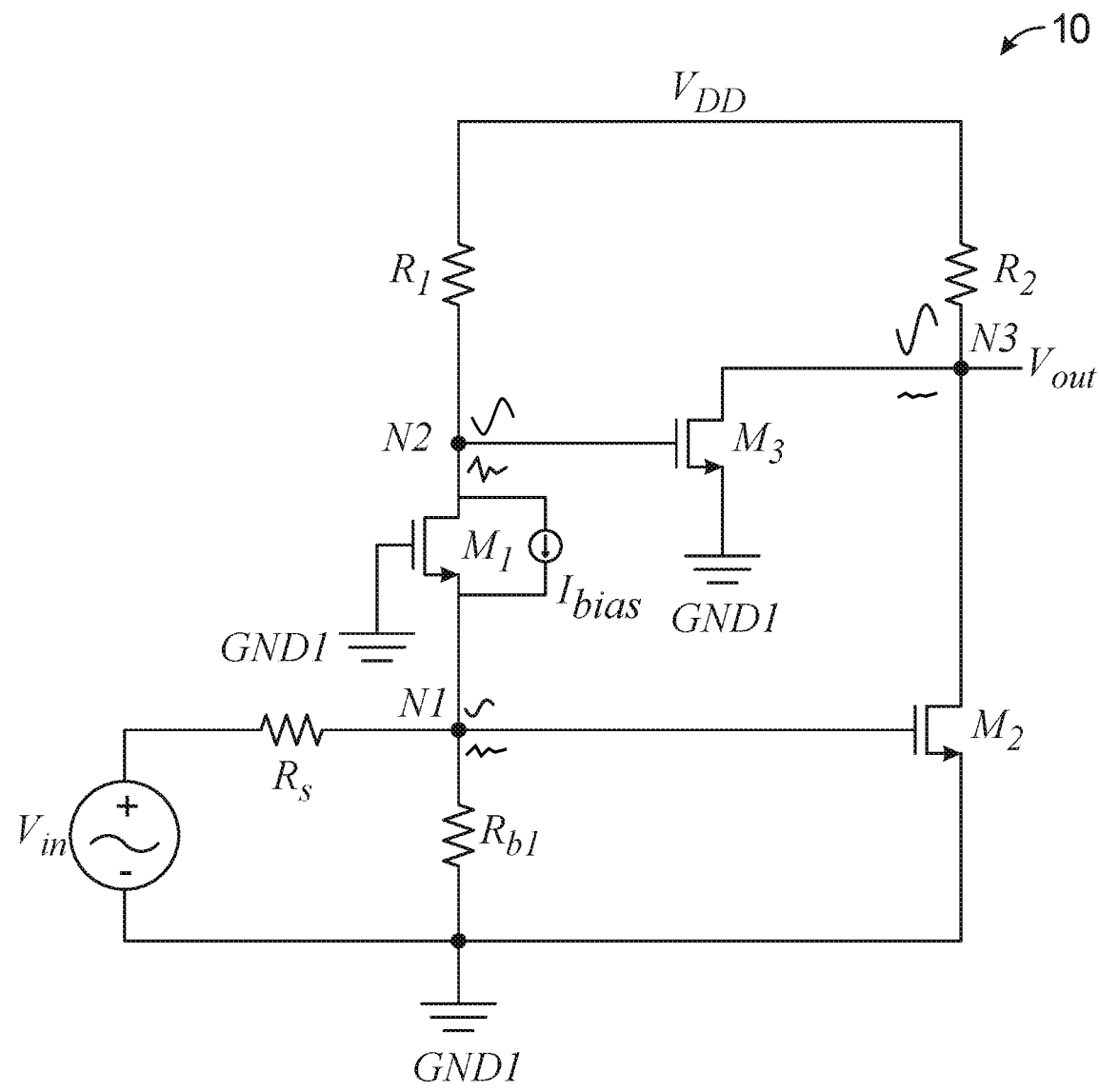
FIG. 2 is a schematic of a wideband single-ended LNA with noise cancellation (bias circuit is not shown).

FIG. 2 is a schematic of another version of the related-art amplifier 10 that adds a third transistor $M_3$ that is to invert the output of the first transistor $M_1$ and sum the transconductance of the second transistor $M_2$ and the third transistor $M_3$ at the third node N3. Moreover, the third transistor $M_3$ is configured to convert differential output to single-ended output.

Figure 3:
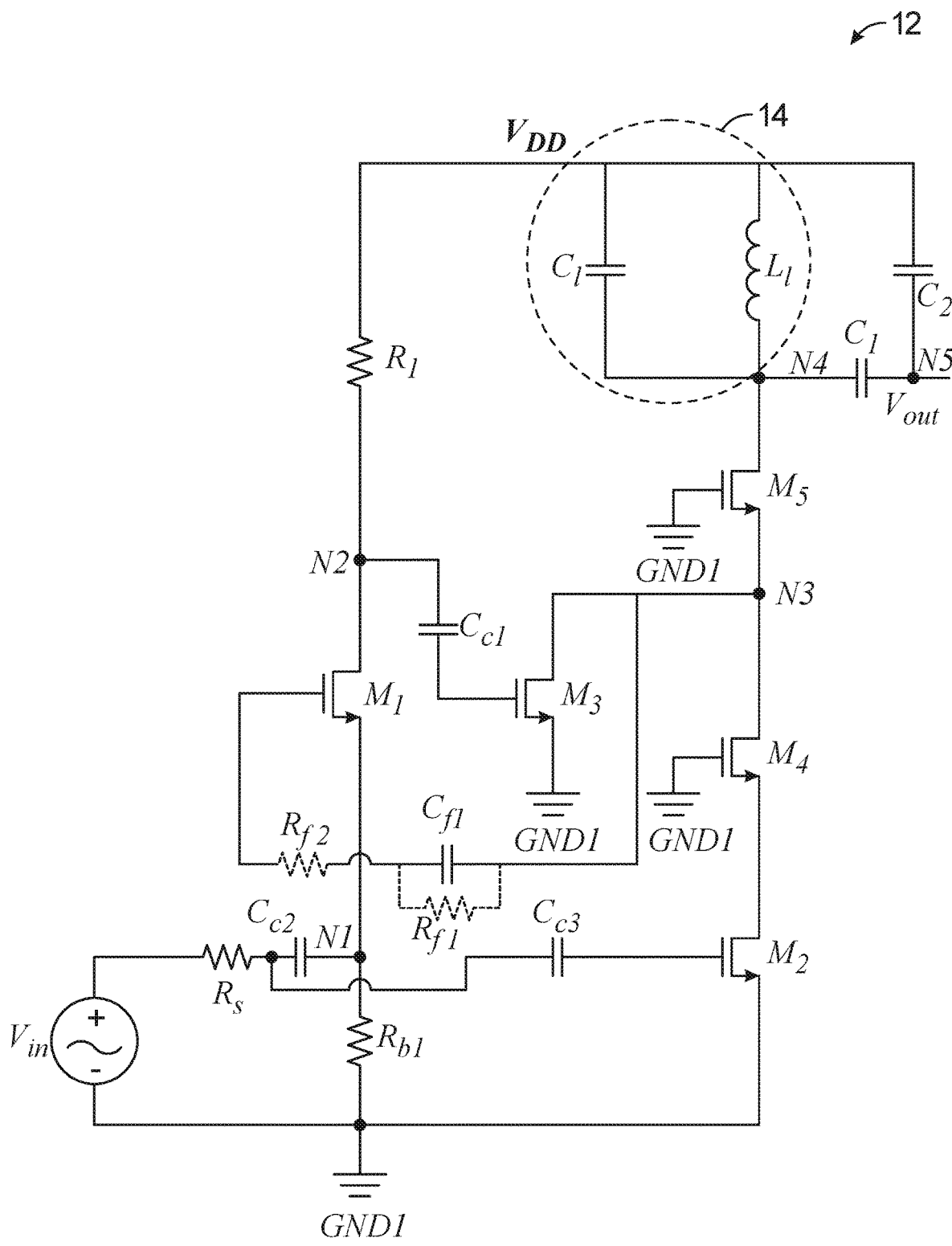
FIG. 3 is a schematic of a self-tuned input-matching LNA with reduced noise contribution of a load resistor and a bias resistor in accordance with the present disclosure (bias circuit is not shown).

As depicted in FIG. 3, the channel noise can be cancelled if $$R_s \cdot gm_2 = gm_3 \cdot R_1. \tag{3}$$

Assuming that input impedance is matched to $R_s$, Equation (3) is simplified to $$gm_2/gm_3 = gm_1 \cdot R_1 \tag{4}$$

However, the channel noise of the first transistor $M_1$ can be cancelled, but the noise contribution from the bias resistor $R_{b1}$ and first resistor $R_1$ is substantial, which leads to an increased noise factor (NF) of more than 2 dB.

FIG. 3 is a schematic of an LNA 12 that is structured and configured in accordance with the present disclosure to substantially improve the NF over the related-art LNA 10 depicted in FIGS. 1 and 2. In this exemplary embodiment, a coupling capacitor $C_{C1}$ is coupled between the gate of $M_3$ and the second node N2. The coupling capacitor $C_{C1}$ makes possible to have individual bias voltage for $M_3$, which plays an important role for harmonic cancellation of two concurrent paths (CG and CS). In the exemplary embodiment depicted in FIG. 3, a second coupling capacitor $C_{C2}$ is coupled between a source resistor $R_s$ and the first node N1. A third coupling capacitor $C_{C3}$ is coupled between a gate of the second transistor $M_2$ and the source resistor $R_s$ and the second coupling capacitor $C_{C2}$, which effectively couples the gate of the second transistor $M_2$ to the first node N1.

In the present disclosure two cascode devices have been employed as follows. A fourth transistor $M_4$ in cascode with the second transistor $M_2$ is coupled between the third node N3 and the drain of the second transistor $M_2$. The fourth transistor $M_4$ improves the gain provided by the second transistor $M_2$, which in turn lowers the level of bias current flowing through the first resistor $R_1$ and the bias resistor $R_{b1}$. As such, the LNA 12 reduces the noise contributions of the first resistor $R_1$ and the bias resistor $R_{b1}$. A fifth transistor $M_5$ is coupled in cascode with the third transistor $M_3$ and provides isolation between the output at a fourth node N4 and the input of the LNA 12 at the first node N1.

The LNA 12 is configured to employ transconductance (gm) enhancement that allows the first transistor $M_1$ to operate with lower bias current while providing the required gm for input matching. To enhance the gm of the transistor $M_1$, a feedback capacitor $C_{f1}$ (abbreviated as $C_f$ in the following equations) is coupled between the gate of the first transistor $M_1$ and the third node N3 that is coupled to the drain of the third transistor $M_3$. In this exemplary embodiment, the third node N3 may be referred to as a feedback output node. A capacitance value for the feedback capacitor $C_{f1}$ is between 100 femtofarads and femtofarads. In some embodiments, the capacitance value of the feedback capacitor $C_{f1}$ is 250 femtofarads ±20%. In other exemplary embodiments, the capacitance value for the feedback capacitor is 250 femtofarads ±10%. The feedback capacitor $C_{f1}$ may be a metal-insulator-metal that occupies no more than around 10×12 micrometers of die real estate. A first optional resistor $R_{f1}$ shown in dashed line may be coupled parallel with feedback capacitor $C_{f1}$, and/or a second optional resistor $R_{f2}$, also shown in dashed line, may be added in series with feedback capacitor $C_{f1}$ to increase the reverse isolation and improve the stability factor with a trade-off to degraded input matching. Resistances of the first optional resistor $R_{f1}$ and the second optional resistor $R_{f2}$ may be optimized to provide the best performance considering the trade-off between stability factor and reverse isolation. Since the third node N3 is in the opposite phase of input voltage with no need for an additional inverter amplifier, the source-gate voltage of the first transistor $M_1$ is increased as follows:

$$Vsg = (1+A_v) \cdot v_{in} \qquad (5)$$

where $A_v$ is boosting factor. The boosting factor $A_v$ is equal to the gain from the input to the feedback output node, which is the sum of the gain of the stage of the first transistor $M_1$ followed by the inverter-configured third transistor $M_3$ and the gain of the stage of the second transistor $M_2$ as follows:

$$A_v = \frac{Rcas.(gm2 + R1.gm1.gm3)}{1 - Rcas.R1.gm1.gm3} \quad Cf \gg Cgs1 \qquad (6)$$

where $R_{cas}$ is the impedance seen from the third node N3 to which the source of the fifth transistor $M_5$ is coupled. Increased source-gate voltage is equivalent to enhancing the transconductance, and the gate-source capacitance, with the same boosting factor. Therefore, the input-matching condition changes to the following:

$$R_{in} = \frac{1}{(1 + A_v).gm_1} = R_s \qquad (7)$$

Then, the noise of $M_1$ is cancelled if:

$$gm_2/gm_3 = (1+A_v) \cdot gm_1 \cdot R_1 \qquad (8)$$

It is worth mentioning that a large boosting factor in this design can be achieved because of amplification through both the amplifier stage of the first transistor $M_1$ and the amplifier of the second transistor $M_2$. Therefore, the required transconductance $gm_1$ of the first transistor $M_1$ for input matching is reduced considerably as large as the boosting factor, which can be achieved relatively easily by lower bias current and by preserving substantial gate-source overdrive voltage for better linearity performance. On the other hand, lower current flowing through the first transistor $M_1$ releases voltage headroom, which allows large load and bias resistors such as the first resistor $R_1$ to be used to reduce the noise contribution.

In the present embodiment, by using two cascode devices, the boosting factor ($A_v$) can be increased, which further reduces the bias current of the CG stage and consequently the noise contribution of the load and bias resistor of the CG stage. Using one cascode device or taking the drain of $M_2$/source of $M_4$ as output feedback node only provides smaller boosting factor, which does not lead to considerable noise reduction. For applications for which still higher noise figure is acceptable, one cascode device can be used to preserve more voltage headroom, or $M_2$/source of $M_4$ can be taken as the feedback output node.

Figure 4:
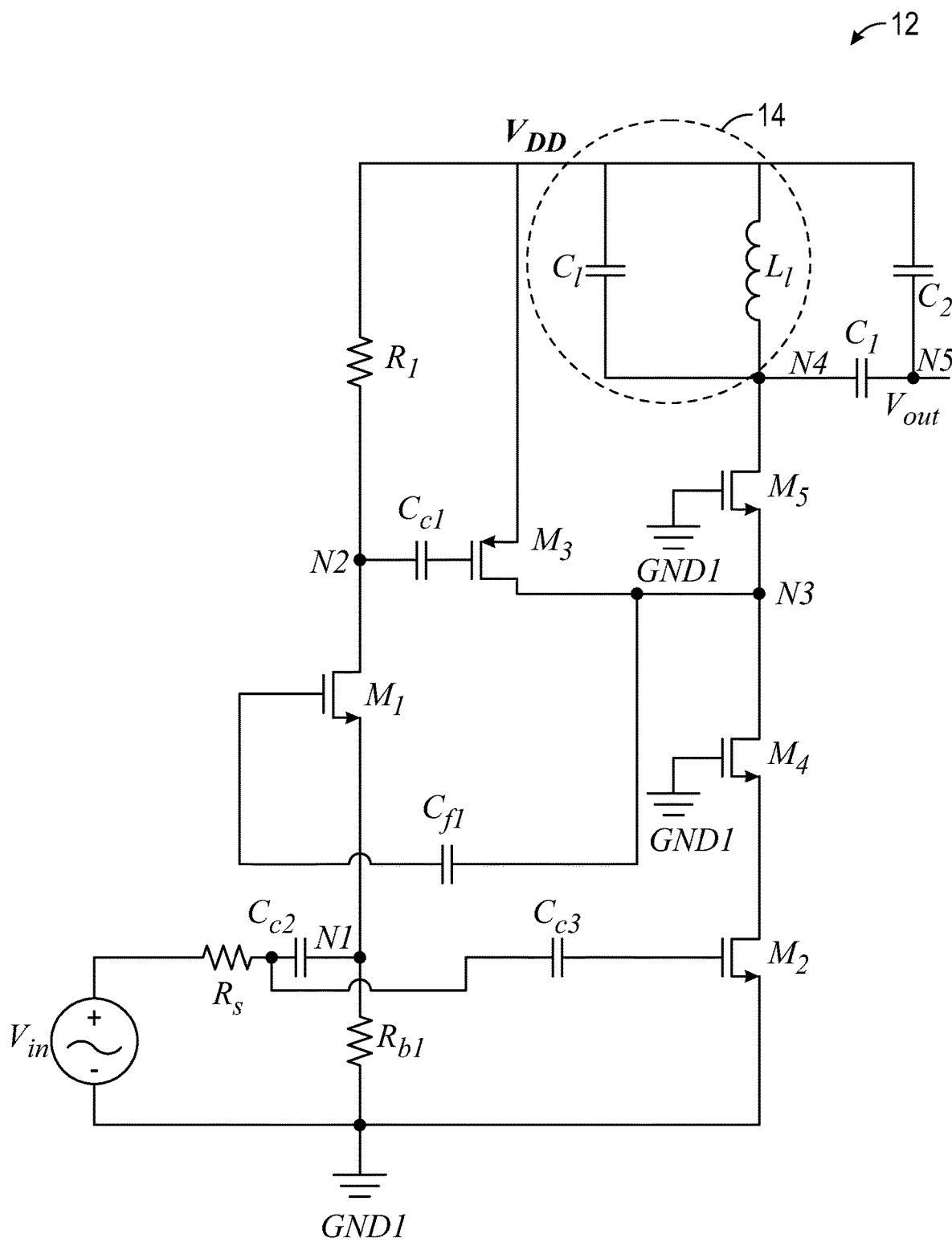
FIG. 4 is a schematic showing another embodiment based on the circuit of FIG. 3 and using a p-type metal oxide semiconductor as an inverter to reuse the bias current and cancelling harmonics.
Figures 5A, 5B:
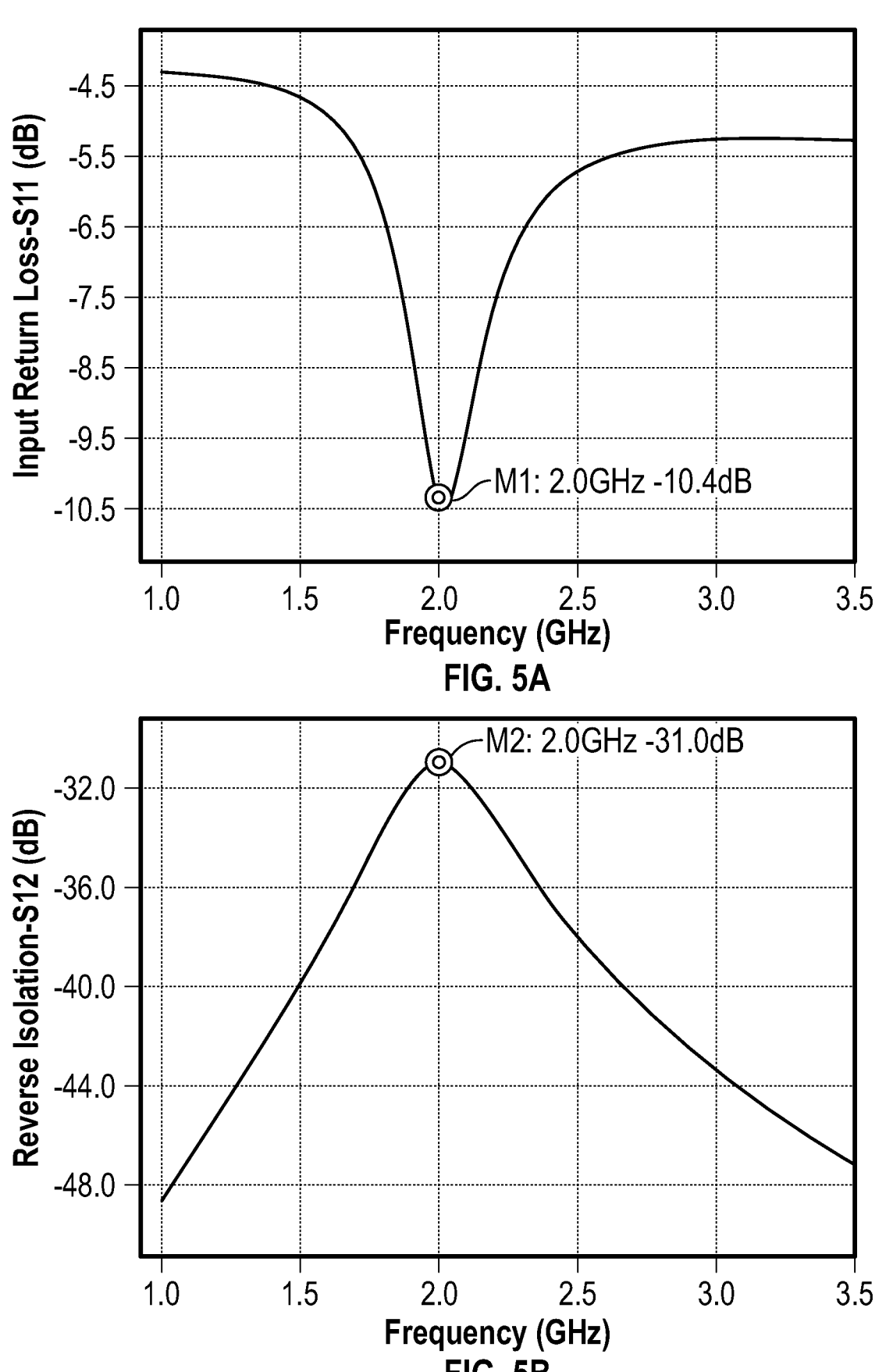
FIG. 5A is a graph showing input return loss for the LNA in accordance with the present disclosure.
FIG. 5B is a graph showing reverse isolation for the LNA in accordance with the present disclosure.
Figures 5C, 5D:
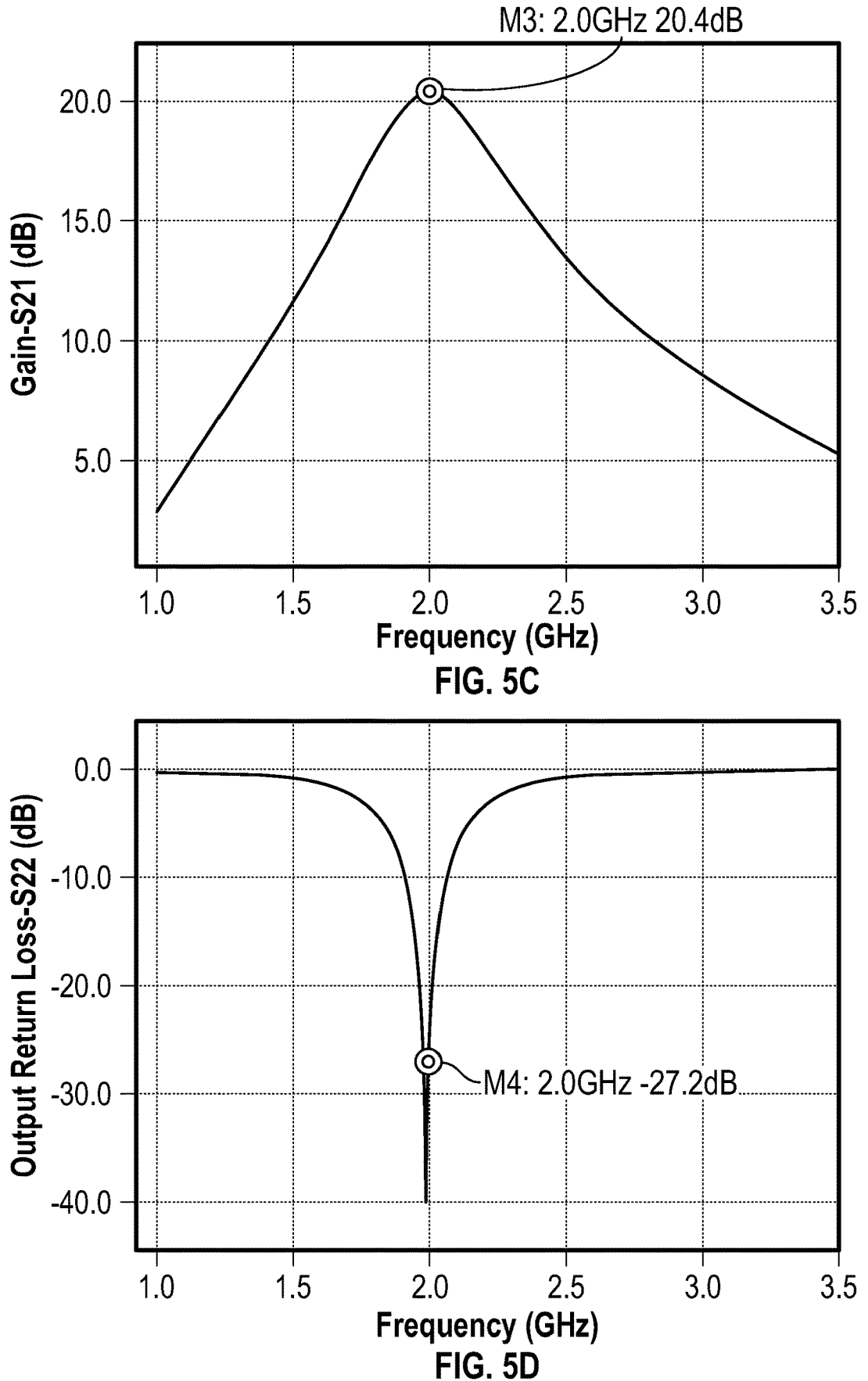
FIG. 5C is a graph showing gain for the LNA in accordance with the present disclosure.
FIG. 5D is a graph showing output return loss for the LNA in accordance with the present disclosure.

As depicted in FIG. 4, a schematic of another embodiment of the LNA has a positive metal oxide semiconductor (PMOS) transistor instead of a negative metal oxide semiconductor (NMOS) transistor used as an inverter ($M_3$). This allows bias current of the third transistor $M_3$ to be re-used by the second transistor $M_2$, and therefore a substantial current is saved. Another benefit of this embodiment is the cancelling of harmonics by using complementary devices. This embodiment can be implemented in advanced technology nodes where PMOS has similar cut-off frequency as NMOS.

Self-Tuned Input Matching

Since the 4G/5G front-end modules are designed based on the carrier aggregation concept, for each band a dedicated LNA core is used. As depicted in FIG. 3, each dedicated LNA core as represented by the LNA 12 has an output tank 14 having a tank inductor Li and a tank capacitor C1. A resonance frequency of the output tank 14 of each LNA core is centered at the mid-frequency of the band and is matched to 50Ω to drive an external receiver module. In this design a conventional resonator is used as load of the LNA 12 and is matched to 50Ω by a capacitor transformer, made up of a first impedance matching capacitor $C_1$ and a second impedance matching capacitor $C_2$.

An important feature of the disclosed LNA 12 is that the input impedance matching is not wideband but rather is narrow band, which automatically without any additional circuitry is tunable over a wide frequency range at the same center frequency of the output tank 14. The input matching condition is met if the required gain ($A_v$) to boost $gm_1$ is obtained. The required gain from input to cascode node ($A_v$) is achieved at the resonance frequency of the output tank since a resistance $R_{cas}$ seen from the third node N3 reaches to its maximum value. In other words, the impedance seen from the third node N3 depends on an impedance $Z_l$ of output tank 14 as follows:

$$R_{cas} = \frac{Z_l + r_{o5}}{1 + gm_5.r_{o5}} \| r_{o3} \| r_{o4}.(1 + gm_4.r_{o2}) \qquad (9)$$

Considering the gate-source capacitance $Cgs_1$ of the first transistor $M_1$ and the gate-to-source capacitance $Cgs_2$ of the second transistor $M_2$ and substituting Equation (9) in Equation (6), then Equation (7) gives the input impedance Zin as follows:

$$Z_{in} = \left[ \left( \frac{1}{gm_1} \middle\| \frac{1}{Cgs_1} \right) \cdot \left( \frac{1 - \left( \frac{Z_l + r_{o5}}{1 + gm_5.r_{o5}} \| r_{o3} \| r_{o4}.(1 + gm_4.r_{o2}) \right).Rl.gm1.gm3}{1 + gm2 \left( \frac{Z_l + r_{o5}}{1 + gm_5.r_{o5}} \| r_{o3} \| r_{o4}.(1 + gm_4.r_{o2}) \right)} \right) \middle\| \frac{1}{Cgs_2} \right] \qquad (10)$$

From Equation (9), the input impedance Zin follows the impedance of output tank 14, which means that the input impedance Zin resonates at very close frequency to the center frequency of output tank 14 (deviation is mainly because of $Cgs_2$ and $Cgs_1$), where at the resonance frequency the input resistance is set to be equal to the resistance of the RF source resistance $R_s$.

Simulation Results

The LNA 12 was implemented in 90 nm silicon-on-insulator technology with a supply voltage $V_{DD}$ of 1.2 V for frequency range of 1.4 GHz to 2.7 GHz. The first transistor $M_1$ is biased with very low current of 0.28 mA. The bias currents of the second transistor $M_2$ and the third transistor $M_3$ are about 11.4 mA and 0.3 mA, respectively. The current consumption is in the level of a conventional narrow band LNA. About 20 femtofarads of capacitance for an input pad at the first node N1 and 100 picohenries of parasitic inductance for the fixed voltage node GND1 pad are considered. The LNA 12 is matched to 50Ω at both the first node N1 (i.e., the input node) and the fifth node N5 (i.e., the output node).

A high gain of >20 dB can be reached using an inductance value of 2.5 nanohenries with a quality factor of 12 for the tank inductor $L_t$. The reverse isolation is relatively high because of the cascode configuration of the fourth transistor $M_4$ and the fifth transistor $M_5$, which also acts as a cascode device for the first transistor $M_1$. The third transistor $M_3$ also provides additional isolation. Small signal parameters for input matching, reverse isolation, gain, and output matching at 2 GHz are shown in FIGS. 5A to 5D.

Figure 6:
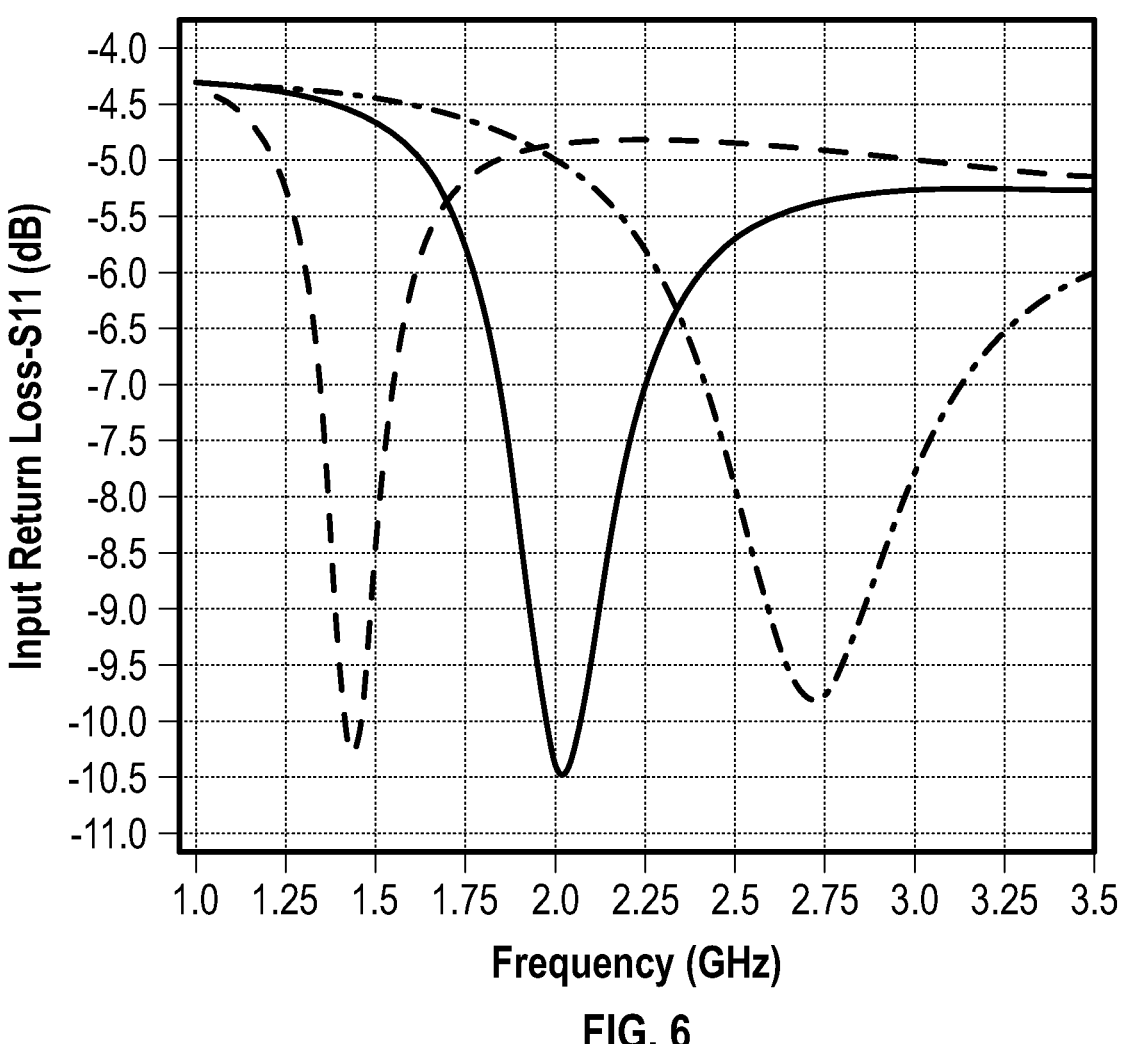
FIG. 6 is a graph showing self-tuned input matching over a frequency range of 1.4 GHz to 2.7 GHz for the LNA in accordance with the present disclosure.

To demonstrate self-tuning of input matching, the center frequency of the output tank 14 is tuned at three frequency points: 1.4 GHz, 2 GHz, and 2.7 GHz. As can be observed from FIG. 6, the input matching is self-tuned along with tuning the center frequency of output tank 14 (FIG. 3). The selectivity at input helps to attenuate out-of-band components to improve the linearity.

Figures 7A, 7B:
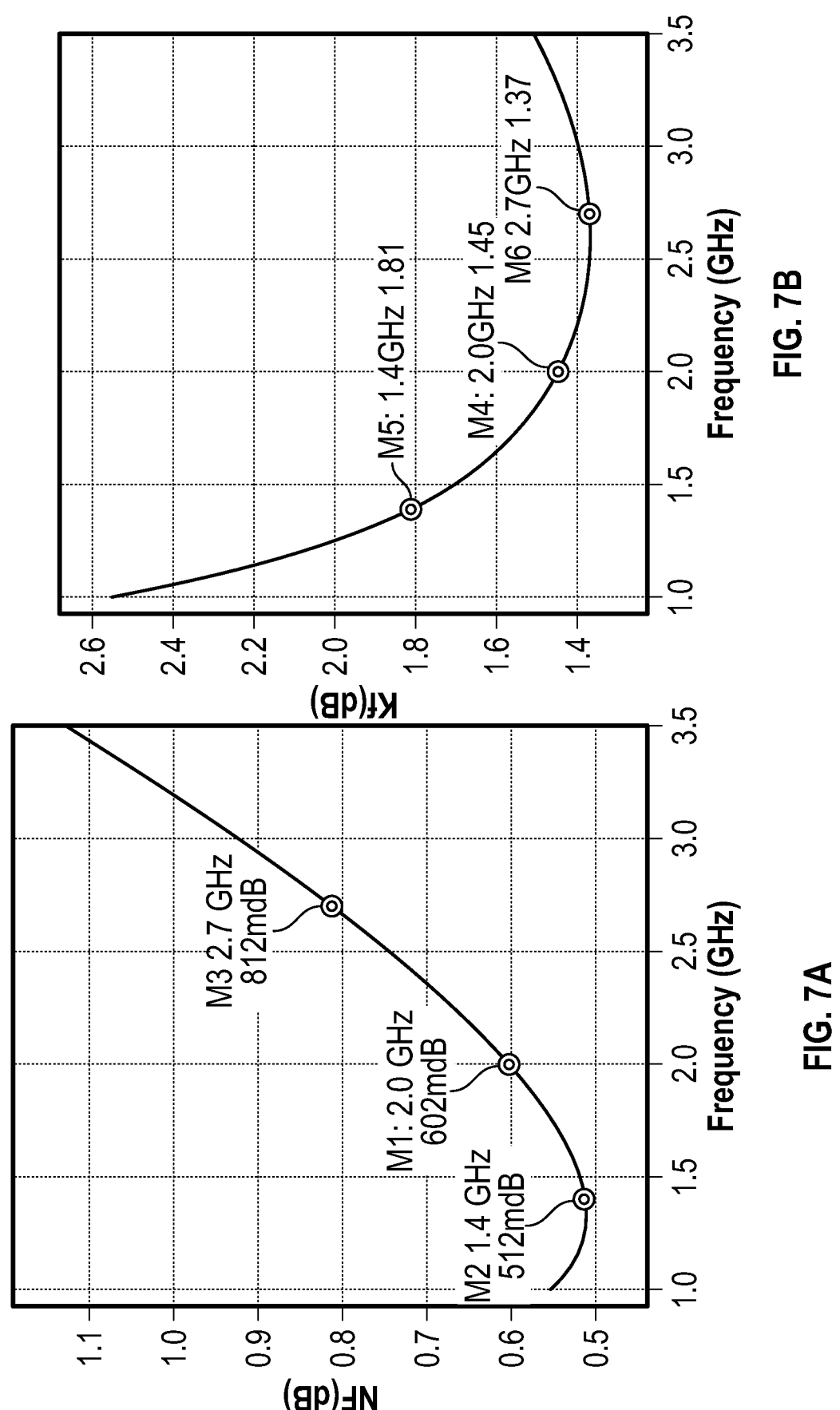
FIG. 7A is a plot showing noise figure for the LNA in accordance with the present disclosure.
FIG. 7B is a plot showing the stability factor for the LNA in accordance with the present disclosure.

Very low noise figure of 0.51 dB to 0.81 dB is achieved within the 1.4 GHz to 2.7 GHz frequency range, as shown in FIG. 7A. The noise contribution of each of the first transistor $M_1$, the second transistor $M_2$, the third transistor $M_3$, the fourth transistor $M_4$, the fifth transistor $M_5$, load resistor ($R_1$), and bias resistor (Rb) is given by the following Table 1. As can be observed from Table 1, the noise of the first transistor $M_1$ is cancelled and the noise contribution of the first resistor $R_1$ and the bias resistor $R_{b1}$ is considerably reduced (5% of total noise) by using this disclosed gm boosting technique. Table 1 also demonstrates the effectiveness of the disclosed embodiments to reduce noise figure of the LNA 12, because without using gm boosting, the noise contribution of load and bias resistors can be quite large and comparable with noise of the first transistor $M_1$. The noise figure is mainly determined by the gm of the second transistor $M_2$.

TABLE 1

| Noise contribution of devices | | | |
|---|---|---|---|
| Device | Parameter | Noise Contribution (V2) | % of Total |
| Input | rn | 4.183e−9 | 76.06 |
| M2 | id | 8.061e−10 | 14.66 |
| Rb | Thermal | 1.424e−10 | 2.59 |
| R1 | Thermal | 1.291e−10 | 2.35 |
| M5 | id | 6.120e−11 | 1.11 |
| M3 | id | 2.801e−11 | 0.51 |
| M1 | id | 2.632e−11 | 0.48 |

According to FIG. 7B, the LNA 12 is unconditionally stable over a wide frequency range, since the stability factor is larger than one and because of high reverse isolation provided by employing two cascode devices.

Figure 8A:
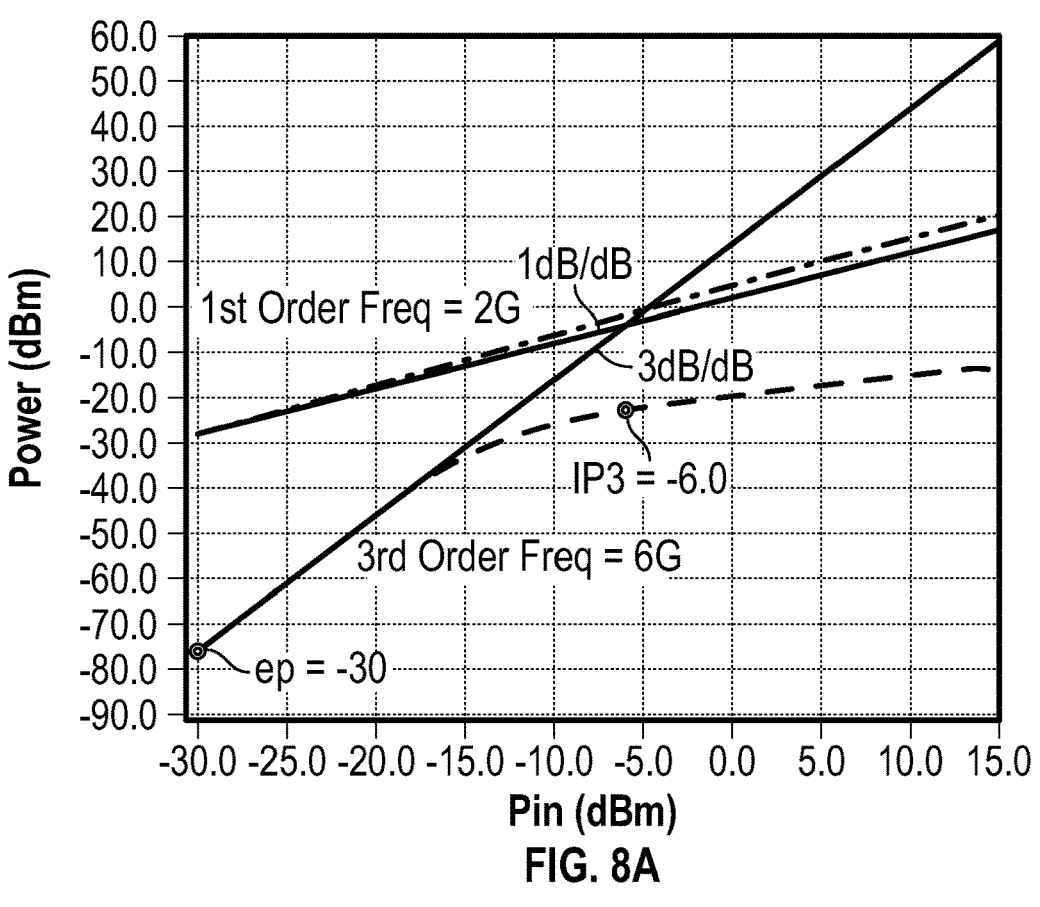
FIG. 8A is a graph showing input-referred IP3 with an extraction point of −30 dBm for the LNA in accordance with the present disclosure.
Figure 8B:
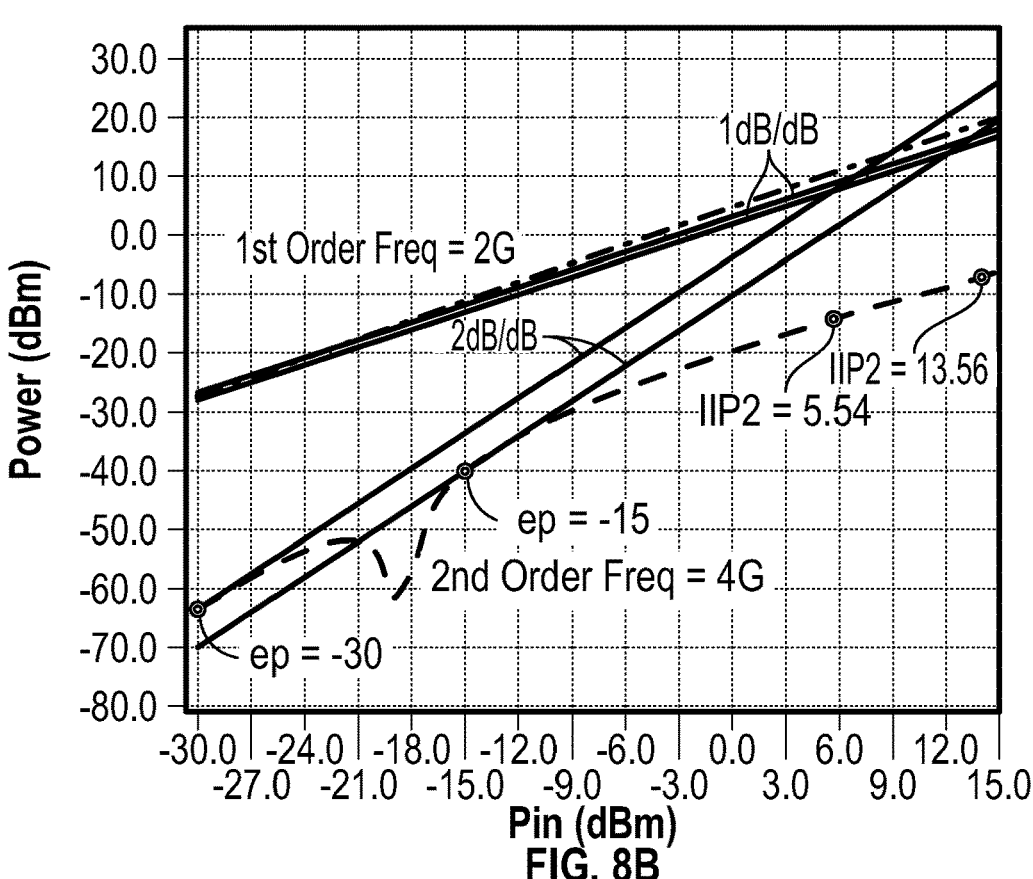
FIG. 8B is a graph showing input-referred IP2 with two extraction points of −15 dBm and −30 dBm for the LNA in accordance with the present disclosure.

The second-order and third-order input-referred interference points are shown in FIGS. 8A and 8B, respectively, for 2 GHz input power. The LNA gain is set to 20.4 dB, and an IIP3 of −6 dBm is achieved. The second-order harmonic indicates cancellation effects at input power 25 dBm (specially notched around −20 dBm input power). Therefore, IIP2 value depends on the extraction point. Two extraction points of small input power (−30 dBm) and large input power (−15 dBm) give +5.5 dBm and +13.5 dBm for IIP2, respectively.

Figure 9:
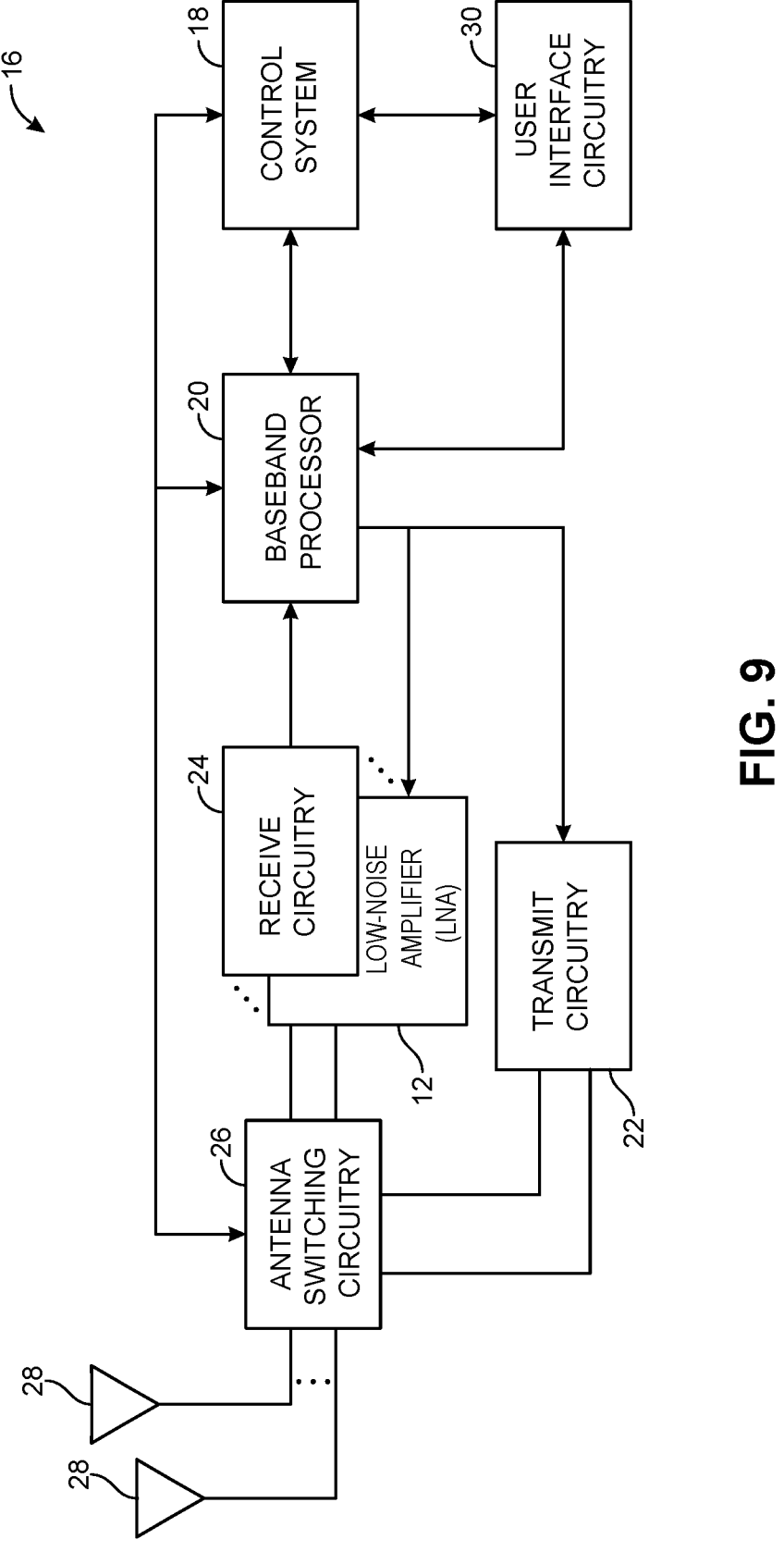
FIG. 9 is a diagram showing how the disclosed LNA may interact with user elements such as wireless communication devices.

With reference to FIG. 9, the concepts described above may be implemented in various types of wireless communication devices or user elements 16, such as mobile terminals, smart watches, tablets, computers, navigation devices, access points, and the like that support wireless communications, such as cellular, wireless local area network (WLAN), Bluetooth, and near-field communications. The user elements 16 will generally include a control system 18, a baseband processor 20, transmit circuitry 22, receive circuitry 24 that includes the LNA 12 (FIG. 3 and FIG. 4), antenna switching circuitry 26, multiple antennas 28, and user interface circuitry 30. The receive circuitry 24 receives radio frequency signals via the antennas 28 and through the antenna switching circuitry 26 from one or more basestations. A low-noise amplifier and a filter cooperate to amplify and remove broadband interference from the received signal for processing. Downconversion and digitization circuitry (not shown) will then downconvert the filtered, received signal to an intermediate or baseband frequency signal, which is then digitized into one or more digital streams.

The baseband processor 20 processes the digitized received signal to extract the information or data bits conveyed in the received signal. This processing typically comprises demodulation, decoding, and error correction operations. The baseband processor 20 is generally implemented in one or more digital signal processors and application-specific integrated circuits.

For transmission, the baseband processor 20 receives digitized data, which may represent voice, data, or control information, from the control system 18, which it encodes for transmission. The encoded data is output to the transmit circuitry 22, where it is used by a modulator to modulate a carrier signal that is at a desired transmit frequency or frequencies. A power amplifier will amplify the modulated carrier signal to a level appropriate for transmission and deliver the modulated carrier signal through the antenna switching circuitry 26 to the antennas 28. The antennas 28 and the replicated transmit circuitry 22 and receive circuitry 24 may provide spatial diversity. Modulation and processing details will be understood by those skilled in the art.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:
1. A low-noise amplifier comprising:
a first transistor having a first current terminal coupled to a supply voltage rail through a load resistor and a second current terminal coupled to an input node, wherein a bias resistor is coupled between the input node and a fixed voltage node;
a second transistor having a third current terminal coupled to an output feedback node and a fourth current terminal coupled to the fixed voltage node;
a third transistor having a gate coupled to the first current terminal of the first transistor, a fifth current terminal coupled to the output feedback node, and a sixth current terminal coupled to the fixed voltage node; and
a feedback capacitor coupled between a gate of the first transistor and the output feedback node, wherein capacitance of the feedback capacitor is sized to eliminate the need for coupling an input impedance matching inductor to the input node.
2. The low-noise amplifier of claim 1 wherein the fixed voltage node is ground.
3. The low-noise amplifier of claim 1 wherein a capacitance value for the feedback capacitor is between 100 femtofarads and 500 femtofarads.

4. The low-noise amplifier of claim 1 wherein a capacitance value of the feedback capacitor is 250 femtofarads ±20%.

5. The low-noise amplifier of claim 1 wherein a capacitance value for the feedback capacitor is 250 femtofarads ±10%.

6. The low-noise amplifier of claim 1 wherein the gate of the third transistor is coupled to the first current terminal of the first transistor by way of a coupling capacitor.

7. The low-noise amplifier of claim 1 wherein the second transistor is coupled to the feedback output node through a cascode-configured fourth transistor.

8. The low-noise amplifier of claim 7 wherein the feedback output node is coupled to an output node through a cascode-configured fifth transistor.

9. The low-noise amplifier of claim 1 wherein the noise factor contribution of the load resistor and the bias resistor is less than 5% of total noise.

10. A method of amplifying a low-noise signal using a low-noise amplifier having a first transistor having a first current terminal coupled to a supply rail through a load resistor and a second current terminal coupled to an input node, a bias resistor coupled between the input node and a fixed voltage node, a second transistor having a third current terminal coupled to an output feedback node and a fourth current terminal coupled to the fixed voltage node, a third transistor having a gate coupled to the first current terminal of the first transistor, a fifth current terminal coupled to the feedback output node, and a sixth current terminal coupled to the fixed voltage node, and a feedback capacitor between a gate of the first transistor and the output feedback node, the method comprising:

applying a signal to the input node without employing an input matching inductor at the input node; and amplifying the signal using the first transistor and the second transistor, thereby generating an amplified output signal at the output feedback node.

11. The method of amplifying the low-noise signal using the low-noise amplifier of claim 10 wherein the fixed voltage node is ground.

12. The method of amplifying the low-noise signal using the low-noise amplifier of claim 10 wherein a capacitance value for the feedback capacitor is between 100 femtofarads and 500 femtofarads.

13. The method of amplifying the low-noise signal using the low-noise amplifier of claim 10 wherein a capacitance value of the feedback capacitor is 250 femtofarads ±20%.

14. The method of amplifying the low-noise signal using the low-noise amplifier of claim 10 wherein a capacitance value for the feedback capacitor is 250 femtofarads ±10%.

15. The method of amplifying the low-noise signal using the low-noise amplifier of claim 10 wherein the gate of the third transistor is coupled to the first current terminal of the first transistor by way of a coupling capacitor.

16. The method of amplifying the low-noise signal using the low-noise amplifier of claim 10 wherein the second transistor is coupled to the feedback output node through a cascode-configured fourth transistor.

17. The method of amplifying the low-noise signal using the low-noise amplifier of claim 16 wherein the feedback output node is coupled to an output node through a cascode-configured fifth transistor.

18. The method of amplifying the low-noise signal using the low-noise amplifier of claim 10 wherein the noise factor contribution of the load resistor and the bias resistor is less than 5% of the total noise.

19. A wireless communication device comprising:

receive circuitry configured to receive radio frequency (RF) signals, wherein the receive circuitry comprises a low-noise amplifier configured to amplify the RF signals;

and the low-noise amplifier comprising:

a first transistor having a first current terminal coupled to a supply voltage rail through a load resistor and a second current terminal coupled to an input node, wherein a bias resistor is coupled between the input node and a fixed voltage node;

a second transistor having a third current terminal coupled to an output feedback node and a fourth current terminal coupled to the fixed voltage node;

a third transistor having a gate coupled to the first current terminal of the first transistor, a fifth current terminal coupled to the output feedback node, and a sixth current terminal coupled to the fixed voltage node; and a feedback capacitor coupled between a gate of the first transistor and the output feedback node, wherein capacitance of the feedback capacitor is sized to eliminate the need for coupling an input impedance matching inductor to the input node.

20. The wireless communication device of claim 19 wherein the fixed voltage node is ground.

21. The wireless communication device of claim 19 wherein a capacitance value for the feedback capacitor is between 100 femtofarads and 500 femtofarads.

22. The wireless communication device of claim 19 wherein a capacitance value of the feedback capacitor is 250 femtofarads ±20%.

23. The wireless communication device of claim 19 wherein a capacitance value for the feedback capacitor is 250 femtofarads ±10%.

24. The wireless communication device of claim 19 wherein the gate of the third transistor is coupled to the first current terminal of the first transistor by way of a coupling capacitor.

25. The wireless communication device of claim 19 wherein the second transistor is coupled to the feedback output node through a cascode-configured fourth transistor.

26. The wireless communication device of claim 25 wherein the feedback output node is coupled to an output node through a cascode-configured fifth transistor.

27. The wireless communication device of claim 19 wherein the noise factor contribution of the load resistor and the bias resistor is less than 5% of total noise.

* * * * *